United States Patent [19]

Ho et al.

[11] Patent Number: 4,758,799
[45] Date of Patent: Jul. 19, 1988

[54] BROADBAND, HIGH SPEED VIDEO AMPLIFIER

[75] Inventors: Kesse Ho, Westminister; Bradley B. Cain, Walnut, both of Calif.

[73] Assignee: Hughes Aircraft Company, Los Angeles, Calif.

[21] Appl. No.: 37,913

[22] Filed: Apr. 13, 1987

[51] Int. Cl.$^4$ .............................................. H03F 3/68
[52] U.S. Cl. .................... 330/311; 307/268; 358/184
[58] Field of Search .............. 307/263, 268; 330/310, 330/311; 358/166, 184

[56] References Cited

U.S. PATENT DOCUMENTS

| | | | |
|---|---|---|---|
| 3,573,402 | 4/1971 | Chambers, Jr. | 330/311 X |
| 4,118,731 | 10/1978 | Hinn | 358/184 X |
| 4,419,593 | 12/1983 | Butler et al. | 307/268 |

Primary Examiner—Eugene R. LaRoche
Assistant Examiner—Steven J. Mottola
Attorney, Agent, or Firm—A. W. Karambelas

[57] ABSTRACT

A broadband, high speed, signal inverting video amplifier comprises a generally conventional, main cascode amplifier and first and second current boosting cascode amplifiers means which are capacitively coupled to the main cascode amplifier. The first current boosting amplifier provides a positive current spike in response to an input video signal abruptly decreasing, the positive current spike provided thereby being fed into the main cascode amplifier in a manner causing the current spike to be added to current through the main amplifier when the amplified video signal goes positive. The second current boosting amplifier provides a negative current spike in response to the input video signal abruptly increasing, the negative current spike provided thereby being fed into the main cascode amplifier in a manner causing the such current spike to be substracted from the current through the main amplifier when the amplified video signal goes negative. The positive and negative spikes cause the amplified output video signal to have rise and fall times to be less than about 3.5 nanoseconds at loads of at least about 25 pf at peak-to-peak output voltages of at least about 40 volts and to be no more than about 1.8 nanoseconds at about 20 volts peak-to-peak for a load of about 14.5 pf.

9 Claims, 3 Drawing Sheets

BROADBAND, HIGH SPEED VIDEO AMPLIFIER

BACKGROUND OF THE INVENTION

1. Field of the Invention

The present invention relates generally to the field of video amplifiers and more particularly to wide band, high power video amplifiers, which may be of the hybrid type, configured for providing fast rise time output signals to video displays.

2. Discussion of the Background

Video amplifiers are used to provide high voltage, amplified signals to video displays which typically present a relatively high capacitive load to the amplifiers. Present video amplifiers, having bandwidths of about 50 to 100 MHz, typically provide output signals having voltages of about 25 to 40 volts peak-to-peak, into loads of about 15 to 25 picofarads (pF). Under such conditions, the rise times of the output signals provided by the video amplifiers are typically in the range of about 4 to 8 nanoseconds.

Needs, however, presently exist for improved video amplifiers which meet the performance requirements of new generation, high resolution color, 1000 and 2000 line raster video displays, which have come into demand in military graphics, air traffic control displays and commercial CAD/CAM systems. These new generation video displays typically require extremely fast amplified signal rise times of only about 1 to 3 nanoseconds at 45 to 55 volts peak-to-peak, when driving into loads of between about 4 pf to about 15 pF. Amplifier bandwidths in excess of about 100 MHz are also typically required by such new generation displays.

The rise times of many currently available video amplifiers are thus seen to be comparatively slow with respect to the rise time requirements of new generation displays and result primarily from the relatively high capacitive load into which the amplifiers are required to operate. These high capacitive loads are typically comprised not only of the display capacitance but also, for example, of the distributed wiring, interconnect and circuit card capacitances, part-to-part capacitance and other parasitic capacitances associated with the electronic circuitry in the amplifier output network.

It can be appreciated that with the comparatively slow output signal rise times provided by typical, presently available video amplifiers, very short duration amplifier input signals, having pulse widths equal to or less than the amplifier output signal rise times, are "lost" and cannot be applied to the associated display. Some signal information is accordingly lost and the resolution of the associated display is less than would be possible if the output signal rise time were faster. Such loss of short-duration signals can adversely affect the performance of the display equipment and is, in any event, generally inconsistent with the requirements of most high resolution video displays.

Most video amplifiers presently use conventional solid state cascode amplifiers—that is, amplifiers having a common emitter-common base pair of transistors—as is more particularly discussed below in the description of the present invention. Variations, known as frequency compensation circuits, have been added to conventional cascode amplifiers to decrease the rise and fall times associated therewith. For example, the addition of a capacitance in the emitter leg of the common emitter transistor of a cascode amplifier, often called "emitter compensation," serves to increase the high-frequency current generated in the amplifier. When video pulses are amplified, this technique serves to square off the output signal and reduce the associated rise and fall times thereof. Another such technique is the addition of output inducatance in series and/or shunt with the load capacitance.

There are, however, characteristic problems with compensation circuits. For example, such circuits can, while, improving the rise time, cause a ringing in the output signal at turn on and turn off. Such signal ringing manifests itself in the display as repetitive "ghost" video (such as, for instance, dim vertical streaks following a displayed vertical line), which diminishes the sharpness of the video display and can cause operator confusion when the display is crowded with information. Consequently, additional circuitry is often needed to reduce the ringing caused by the compensation. As a result, wide bandwidth operation is sometimes not achieved.

From the foregoing, it can be appreciated that the development of new means for amplifier compensation is needed, which, when either used alone or combined with existing techniques, can achieve the high amplifier speeds presently coming into demand in today's new high resolution displays. The invention described herein implements a new such approach to amplifier compensation.

SUMMARY OF THE INVENTION

A broadband, fast rise time and fall time, video amplifier, according to the present invention, comprises a main cascode amplifier having a video signal input and an amplified video signal output, and current boosting means coupled to the main cascode amplifier. The current boosting means are configured for causing, whenever the input video signal abruptly changes in a first direction, a current spike to be added to current across an output portion of the main cascode amplifier in a manner causing the rise time of the amplified video signal to be shorter than the rise time which would otherwise be provided by the main cascode amplifier in the absence of the current boosting means. The current boosting means are further configured for causing, whenever the input video signal abruptly changes in a second, opposite direction, a current spike to be subtracted from the current across said main cascode amplifier output portion in a manner causing the fall time of the amplified video signal to be shorter than the fall time which would otherwise be provided by the main cascode amplifier in the absence of the current boosting means.

According to a preferred embodiment, the current boosting means comprise first cascode boost amplifier means for providing the current spike when the video signal abruptly increases and second cascode boost amplifier means for providing the current spike when the video signal abruptly decreases. Inputs of the first and second cascode boost amplifier means are preferably capacitively coupled to the main cascode amplifier so as to receive input video signals therefrom.

Preferably, one of the first and second cascode boost amplifier means comprise portions of the main cascode amplifier. Further, the current boosting means may be configured for enabling the main cascode amplifier to provide amplified video signals having a peak-to-peak voltage of at least about 40 volts and having rise and fall times of less than about 3.5 nanoseconds when the video amplifier is providing amplified video signals to a capacitative load of at least about 25 pf, and to provide rise and fall times of no more than about 1.8 nanoseconds at a capacitive load of about 14.5 pf for about 20 volts peak-to-peak.

BRIEF DESCRIPTION OF THE FIGURES

The present invention may more readily be understood by a consideration of the accompanying drawings in which:

FIG. 3(a) depicting a typical square wave voltage input signal; FIG. 3(b) depicting a typical, uncompensated voltage output signal; FIG. 3(c) depicting a voltage spike signal applied to current boosting portions of the amplifier of FIG. 1; FIG. 3(d) depicting a positive current spike signal provided by a turn on current boosting portion of the amplifier of FIG. 1; FIG. 3(e) depicting a negative current spike signal provided by a turn off current boosting portion of the amplifier of FIG. 1, and FIG. 3(f) depicting a compensated voltage output signal.

DESCRIPTION OF THE PREFERRED EMBODIMENT

Figure 1:
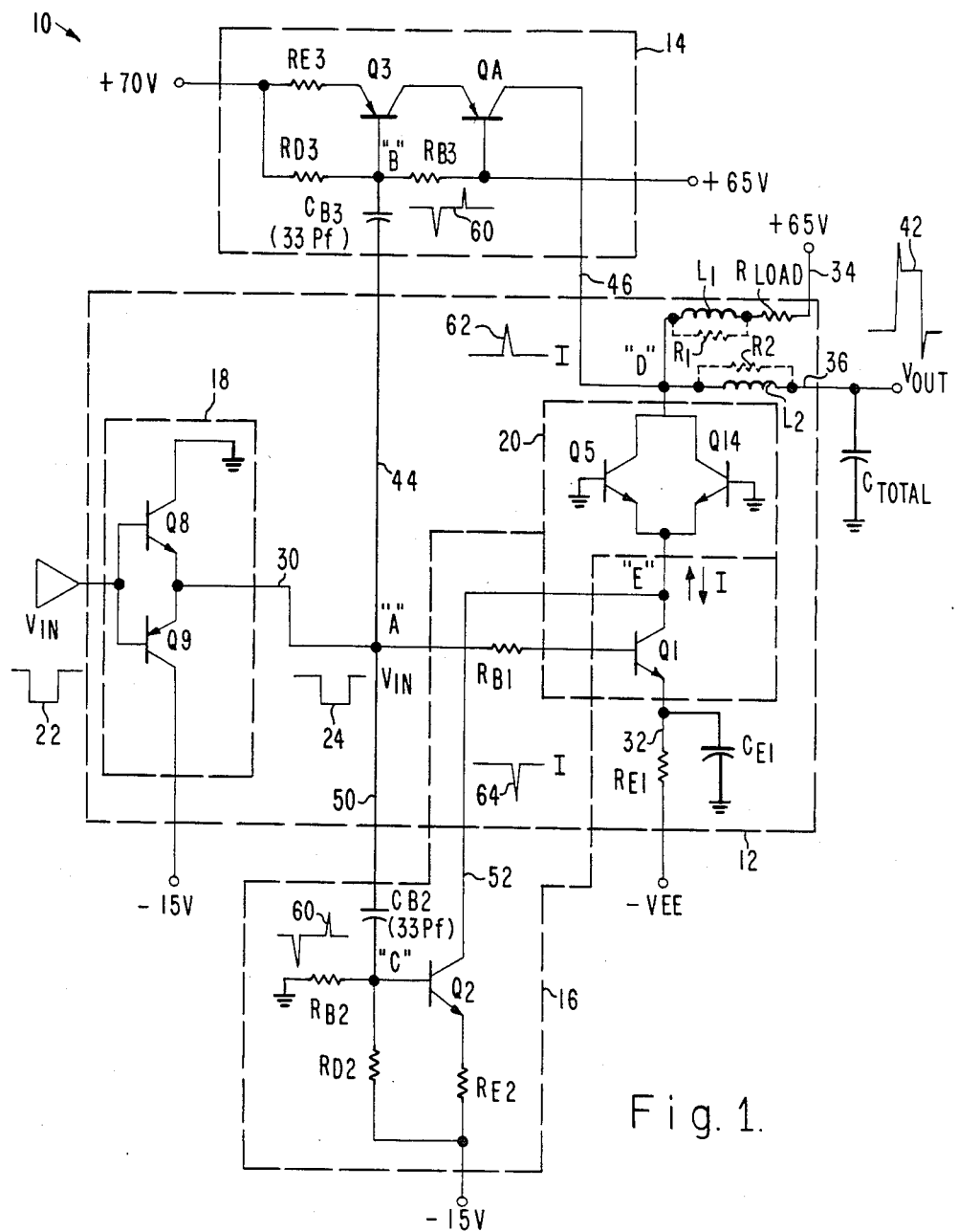
FIG. 1 is a circuit schematic drawing of a simplified version of the high speed video amplifier of the present invention showing the general configuration thereof.

There is shown in FIG. 1 an exemplary circuit diagram of a broad band, fast rise time, signal inverting video amplifier 10 according to the present invention. The circuit depicted in FIG. 1 represents a simplified version of the more detailed circuit diagram of FIG. 2, the simplified version (FIG. 1) being used herein for purposes of describing and explaining the invention so that the invention can be more readily understood.

As depicted in FIG. 1, amplifier 10 comprises generally a primary or main amplifier means 12 and respective first and second current boosting circuits or means 14 and 16. In turn comprising main amplifier means 12 are a conventional input buffer 18 and a conventional cascode amplifier 20. Input buffer 18, to which a video signal, $V_{in}$ (reference number 22), is applied, comprises a complementary pair of NPN-PNP transistors identified in FIG. 1 respectively as Q8 and Q9 (so as to be consistent with corresponding transistor designations in FIG. 2). Emitters of transistors Q8 and Q9 are connected together; the collector of transistor Q8 is grounded and the collector of transistor Q9 is connected to a negative voltage source, for example, −15 volts. Input signal, $V_{in}$, is applied to the bases of both transistors Q8 and Q9. An internal signal, $V_{IN}'$ (reference number 24), is provided, on a line 30, from the emitter junction of transistors Q8 and Q9 to a Point "A" internal to main amplifier means 12.

Comprising cascode amplifier 20 are an NPN transistor Q1 and a pair of parallel connected, matched NPN transistors Q5 and Q14. The use of the two parallel connected transistors Q5 and Q14 is a matter of choice to enable higher power operation than generally would be possible with just one transistor. However, as far as operation of cascode amplifier 20 is concerned, the two transistors Q5 and Q14 function as a single, common base NPN transistor. As shown in FIG. 1, the internal signal, $V_{IN}'$, on line 30 is fed to the base of transistor Q1 through a base resistor, $R_{B1}$. The emitter of transistor Q1 is connected, through an emitter resistor, $R_{E1}$, to −VEE by a conduit 32. The collectors of transistors Q5 and Q14 are connected, through a load resistor, $R_{LOAD}$, to a positive voltage, for example, +65 volts, on a line 34, and the bases of such transistors are grounded. A $V_{OUT}$ line 36 is connected, at a Point "D," between load resistor, $R_{LOAD}$, and the collectors of transistors Q5 and Q14.

A capacitor, designated in FIG. 1 as $C_{TOTAL}$, is depicted as being connected between $V_{OUT}$ line 36 and ground. It is to be understood, however, that capacitor $C_{TOTAL}$ represents the entire capacitance "seen" by amplifier 10, thereby including not only the normal load capacitance of whatever equipment may be connected for receiving the $V_{OUT}$ signal, but other, internal capacitances as well.

From the foregoing description, it can be appreciated that amplifier means 12 are similar to a conventional, cascode-type video signal amplifier. Such a conventional cascode amplifier would, in the absence of first and second current boosting means 14 and 16 of the present invention, typically provide a rounded off, amplified output voltage waveform of the general shape depicted in FIG. 3(b) and identified by reference number 40. Such output signal 40, which has relatively slow rise and fall times (as conventionally defined using the 10 percent and 90 percent points of the waveform) is generally improved by the addition of first and second inductors, $L_1$ and $L_2$, in respective lines 34 and 36, as shown in FIG. 1. Resistors $R_1$ and $R_2$ (shown in phantom lines in FIG. 1) may be added in shunt with respective inductors $L_1$ and $L_2$ to reduce ringing caused by the inductors and provide additional output signal improvement. Such inductors, $L_1$ and $L_2$, and shunt resistors, $R_1$ and $R_2$, may advantageously be incorporated in amplifier 10 as shown.

Amplified video output signal, $V_{OUT}$, can, however, still be substantially improved, and the associated rise and fall times correspondingly decreased, as depicted by waveform 42 in FIGS. 1 and 3(f), by the incorporation of first and second current boosting circuits 14 and 16 (FIG. 1) described hereinbelow.

Referring to FIG. 1, first current boosting circuit 14 is seen to comprise a second cascode amplifier having two PNP transistors Q3 and Q4, the collector of transistor Q3 being connected to the emitter of transistor Q4. The emitter of transistor Q3 is connected, through a resistor $R_{E3}$, to a positive voltage, for example, +70 volts. The base of transistor Q3 is connected, through a base capacitor, $C_{B3}$, to Point "A" of main amplifier means 12 (via a line 44) so as to receive internal voltage signal $V_{IN}'$. A resistor, $R_{D3}$, is connected from a Point "B" at the base of transistor Q3 to the +70 volt supply. A base resistor, $R_{B3}$, is connected from Point "B" to the base of transistor Q4. The collector of transistor Q4 is connected, via a line 46, to Point "D" in line 34 located between the collectors of transistors Q5 and Q14 and inductor $L_1$. The output of first current boosting amplifier circuit 14 is provided, over a line 46, to the output of cascode amplifier 20.

Second current boosting circuit 16 comprises an NPN transistor Q2, the base of which is grounded through a base resistor, $R_{B2}$, and is connected by a line 50, through a capacitor, $C_{B2}$, to Point "A" (at which $V_{IN}'$ is provided). The emitter of transistor Q2 is connected to a negative voltage, for example, −15 volts, through an emitter resistor, $R_{E2}$. A Point "C" at the base of transistor Q2 is connected through a resistor, $R_{D2}$, to the −15 volt source. The collector of transistor Q2 is connected, via a line 52, to a Point "E" located between the collector of transistor Q1 and the emitters of transistors Q5 and Q14. In this latter regard, second current boosting amplifier circuit 16 is considered also to include the pair of transistors Q5 and Q14 as the other portion of what is, therefore, a third cascode amplifier.

Operation of Current Boosting Circuits 14 and 16

From FIG. 1 it can be seen that the $V_{IN}'$ signal provided internally at Point "A" provides at first current boosting circuit Point "B," through capacitor $C_{B3}$, and at second current boosting circuit Point "C," through capacitor $C_{B2}$, a sharp negative-going voltage spike at the leading edge of the $V_{IN}'$ signal and a sharp positive-going voltage spike at the trailing edge of the $V_{IN}'$ signal. A resulting voltage spike signal 60, depicted in FIGS. 1 and 3(c), is thus provided at both Points "B" and "C" by $V_{IN}'$.

Figure 3:
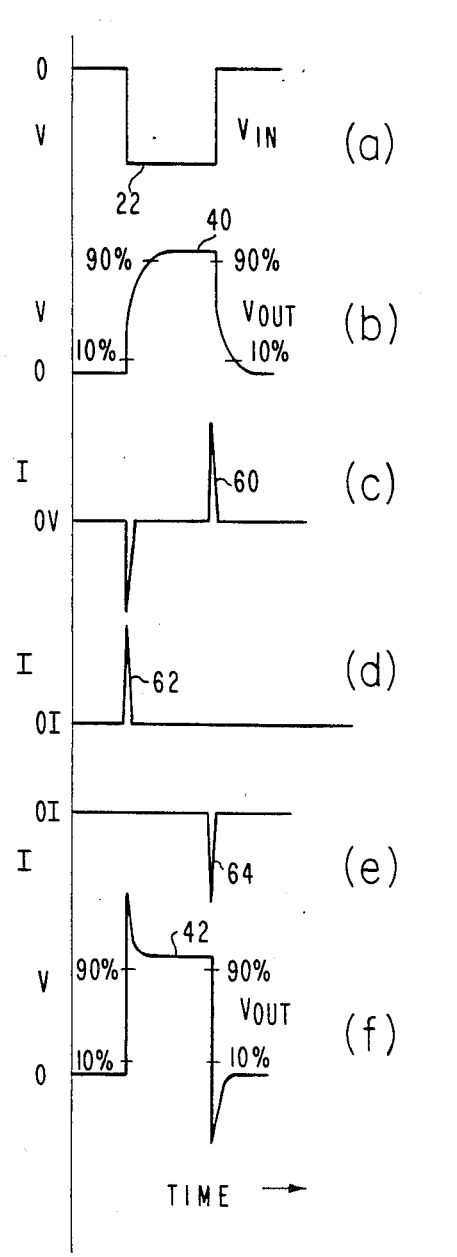
FIG. 3 is a diagram depicting various voltage and current signals associated with the amplifier of FIG. 1.

The negative-going voltage spike of signal 60 at Point "B" of first current boosting amplifier circuit 14 drives the second cascode amplifier on for an instant, thereby causing a positive-going current spike 62, FIGS. 1 and 3(d), to be output to Point "D" associated with cascode amplifier 20 at the instant of $V_{OUT}$ turn on. The positive-going voltage spike at Point "B" has no operational effect on first current boosting amplifier circuit 14 (except as mentioned below). In a similar manner, the positive-going voltage spike of signal 60 at Point "C" of second current boosting amplifier circuit 16 drives the third cascode amplifier on for an instant, thereby causing a negative-going current spike 64, FIGS. 1 and 3(e), to be output to Point "E" of first cascode amplifier 20 at the instant of $V_{OUT}$ turn off. The negative-going voltage spike at Point "C" has no operational effect on second current boosting current amplifier circuit 16 (except as mentioned below).

Positive-going current spike 62 at Point "D" associated with cascode amplifier 20 sharpens the amplifier rise time and negative-going current spike 64 at Point "E" sharpens the amplifier fall time.

By way of illustrative example, coupling capacitors $C_{B2}$ and $C_{B3}$ associated respectively with first and second current boosting amplifier circuits 14 and 16 are indicated on FIG. 1 as having values of 33 pf. Other components shown in such FIG. are not, however, identified as to either type or value since FIG. 1 represents a simplified version of FIG. 2, on which part types or values are indicated.

Figure 2:
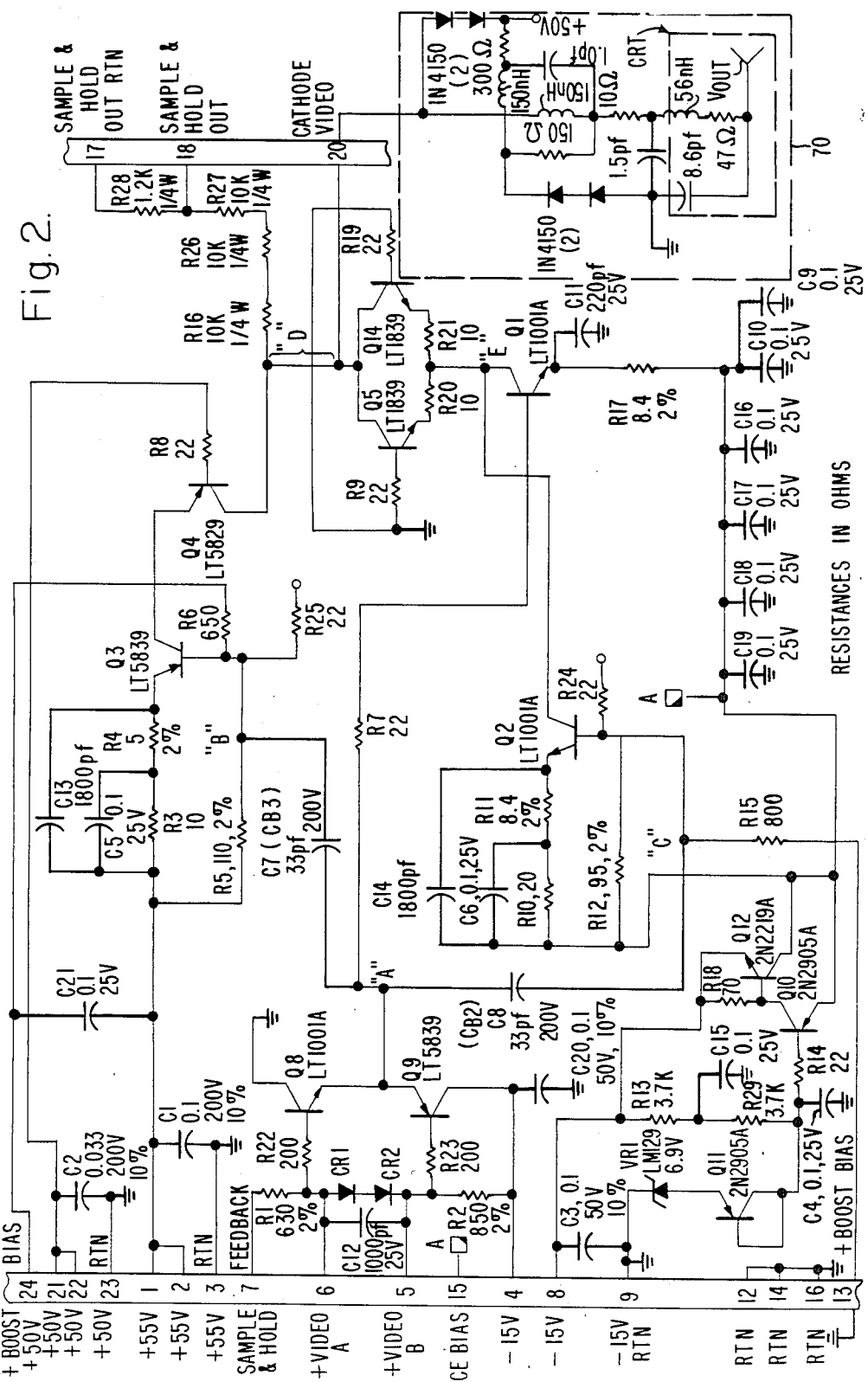
FIG. 2 is a detailed circuit schematic drawing of an exemplary implementation of the high speed video amplifier of the present invention for particular application.

FIG. 2 thus shows in electrical schematic form an exemplary implementation of above-described amplifier 10 which may advantageously be constructed in hybrid electronic form. For reference purposes, the above-described Points "A" through "E" shown in FIG. 1 are identified in FIG. 2. Likewise, the transistor "Q" designations used in FIGS. 1 and 2 are the same. The circuit depicted in FIG. 2 is considered to be self explanatory to those skilled in the electronics art and no useful purpose will be served by a detailed description of such circuit. It is, however, noted that a typical output load is identified in FIG. 2 by reference number 70.

By way of a continued specific example, to which the present invention is not limited, it has been determined that the amplifier circuit depicted in FIG. 2 has capabilities for providing output signal, $V_{OUT}$, rise and fall times of no more than about 3.5 nanoseconds, for a peak-to-peak output signal of about 40 volts, driving a load of at least about 25 pf. Such circuit has also been demonstrated to provide output signal rise and fall times of only about 1.8 nanoseconds driving into a load of about 14.5 pf for about a 20 volt peak-to-peak output signal, and is expected to provide such turn on and turn off times for a 40 volt peak-to-peak output signal.

It is to be appreciated that first current boosting amplifier 14 can alternatively be biased so that, in addition, a negative-going current spike is provided when the input video signal goes positive and/or second current boosting amplifier 16 can alternatively be biased so that, in addition a positive-going current spike is provided when the input video signal goes negative. In such case or cases, the positive current spikes add together and the negative current spikes add together.

Amplifier 10, as depicted in FIGS. 1 and 2 and as described above, is a signal inverting amplifier, as is typical of cascode amplifiers. This signal inverting configuration requires (as described) first current boosting amplifier 14 to provide positive current spike 62 to Point "D" when the input video signal is negative-going and requires second current boosting amplifier 16 to provide negative current spike 64 to Point "E" when the input video signal is positive-going. It is, however, within the scope of the invention to modify amplifier 10, for example, by the addition of signal inverters, so that it is non-signal inverting. In such case, first current boosting amplifier 14 would provide positive current spike 62 to Point "D" in response to the input video signal going positive (instead of negative) and second current boosting amplifier 16 would provide negative current spike 64 to Point "E" in response to the input video signal going negative (instead of positive).

Although there has been described herein a particular embodiment of a high speed, broad band video amplifier in accordance with the present invention for the purpose of illustrating the manner in which the invention may be used to advantage, it is to be understood that the invention is not so limited. Accordingly, any and all variations or modifications which may occur to those skilled in the art are to be considered to be within the scope and spirit of the invention as defined in the appended claims.

What is claimed is:

1. A broadband, fast rise time and fall time, video amplifier which comprises:
   (a) a main cascode amplifier having a video signal input and an amplified video signal output; and
   (b) current boosting means coupled to said main cascode amplifier for causing, whenever the video signal abruptly changes in a first direction, a current spike to be added to current across an output portion of the main cascode amplifier in a manner causing the rise time of the amplified video signal to be shorter than the rise time which would otherwise be provided by the main cascode amplifier in the absence of the current boosting means and for causing, whenever the input video signal abruptly changes in a second, opposite direction, a current spike to be subtracted from the current across said main cascode amplifier output portion in a manner causing the fall time of the amplified video signal to be shorter than the fall time which would otherwise be provided by the main cascode amplifier in the absence of the current boosting means.

2. The video amplifier as claimed in claim 1 wherein the current boosting means comprise first cascode boost amplifier means for providing the current spike when the input video signal abruptly increases and second cascode boost amplifier means for providing the current spike when the input video signal abruptly decreases, inputs of said first and second cascode boost amplifier means being capacitively coupled to the main cascode amplifier.

3. The video amplifier as claimed in claim 2 wherein one of the first and second cascode boost amplifier means comprise portions of the main cascode amplifier.

4. The video amplifier as claimed in claim 1 wherein the current boosting means are configured for enabling the main cascode amplifier to provide amplified video signals having a peak-to-peak voltage of at least about 40 volts and having rise and fall times of less than about 3.5 nanoseconds when the video amplifier is providing amplified video signals to a capacitative load of at least about 25 pf.

5. The video amplifier as claimed in claim 1 wherein the current boosting means are configured for enabling the main cascode amplifier to provide amplified video signals having a peak-to-peak voltage of at least about 20 volts and having rise and fall times of no more than about 1.8 nanoseconds when the video amplifier is providing amplified video signals into a load of about 14.5 pf.

6. A broadband, fast rise time and fall time, video amplifier which comprises:
(a) a main cascode amplifier having a video signal input and an amplified video signal output; and
(b) current boosting means electrically coupled to said main cascode amplifier for causing, whenever the video signal abruptly changes in a first direction, a current spike to be added to current across an output portion of the main cascode amplifier in a manner causing the rise time of the amplified video signal to be shorter than the rise time which would otherwise be provided by the main cascode amplifier in the absence of the current boosting means and for causing, whenever the input video signal abruptly changes in a second, opposite direction, a current spike to be subtracted from the current across said main cascode amplifier output portion in a manner causing the fall time of the amplified video signal to be shorter than the fall time which would otherwise be provided by the main cascode amplifier in the absence of the current boosting means, said current boosting means comprising first cascode boost amplifier means for providing the current spike when the video signal abruptly increases and second cascode boost amplifier means for providing the current spike when the video signal abruptly decreases, inputs of said first and second cascode boost amplifiers being capacitively coupled to the main cascode amplifier.

7. A broadband, fast rise time and fall time, video amplifier which comprises:
(a) a main cascode amplifier having a video signal input and an amplified video signal output, said main cascode amplifier being configured for providing amplified video signals having a peak-to-peak voltage of at least about 40 volts; and
(b) current boosting means coupled to said main cascode amplifier for causing, whenever the input video signal abruptly decreases, a current spike to be added to current across an output portion of the main cascode amplifier in a manner causing the rise time of the amplified video signal to be less than about 3.5 nanoseconds for an amplifier load of at least about 25 pf and for causing, whenever the input video signal abruptly increases, a current spike to be subtracted from the current across said main cascode amplifier output portion in a manner causing the fall time of the amplified video signal to be less than about 3.5 nanoseconds for said amplifier load.

8. The video amplifier as claimed in claim 7 wherein the rise and fall times are no greater than about 1.8 nanoseconds for an amplifier load of about 14.5 pf for about 20 volts peak-to-peak.

9. The video amplifier as claimed in claim 7 wherein inputs of the first and second cascode boost amplifier means are capacitively connected to the main cascode amplifier for receiving video input signals therefrom.

* * * * *